US006805767B2

(12) United States Patent
Shinomiya

(10) Patent No.: US 6,805,767 B2
(45) Date of Patent: Oct. 19, 2004

(54) METHOD FOR PRODUCING SOLID-STATE IMAGE PICKUP DEVICE

(75) Inventor: Kohji Shinomiya, Tokyo (JP)

(73) Assignee: Renesas Technology Corp., Tokyo (JP)

(*) Notice: Subject to any disclaimer, the term of this patent is extended or adjusted under 35 U.S.C. 154(b) by 302 days.

(21) Appl. No.: 10/100,147

(22) Filed: Mar. 19, 2002

(65) Prior Publication Data

US 2003/0066591 A1 Apr. 10, 2003

(30) Foreign Application Priority Data

Oct. 9, 2001 (JP) ........................................ 2001-311406

(51) Int. Cl.⁷ .............................................. B32B 31/20
(52) U.S. Cl. ...................... 156/227; 156/204; 156/226; 361/749
(58) Field of Search ................................ 156/204, 221, 156/226–228, 288, 580; 361/749, 752; 257/432–434, 690, 693, 678, 98–99, 680, 684; 348/340, 374

(56) References Cited

U.S. PATENT DOCUMENTS 5,748,448 A * 5/1998 Hokari ........................ 361/749
5,821,532 A * 10/1998 Beaman et al. ............. 250/239
6,147,389 A * 11/2000 Stern et al. .................. 257/434
6,541,284 B2 * 4/2003 Lam ............................... 438/7
6,646,316 B2 * 11/2003 Wu et al. .................... 257/434
2001/0055073 A1 12/2001 Shinomiya
2002/0044213 A1 4/2002 Shinomiya et al.
2002/0080266 A1 6/2002 Shinomiya et al.

OTHER PUBLICATIONS

U.S. patent application Ser. No. 09/791,584, Kohji Shinomiya, filed Feb. 26, 2001.

U.S. patent application Ser. No. 09/799,690, Shinomiya et al., filed Mar. 7, 2001.

U.S. patent application Ser. No. 09/814,825, Shinomiya et al., filed Mar. 23, 2001.

* cited by examiner

*Primary Examiner*—Jeff H. Aftergut
*Assistant Examiner*—Jessica Rossi
(74) *Attorney, Agent, or Firm*—Leydig, Voit & Mayer, Ltd.

(57) ABSTRACT

A method of producing a solid image pickup device including a solid image pickup element, and an optical lens held in a housing that is mounted on a flexible wiring board. A fixing device fixes the flexible wiring board in a folded state corresponding to an external shape of the solid image pickup device during bonding of the flexible wiring board.

14 Claims, 8 Drawing Sheets

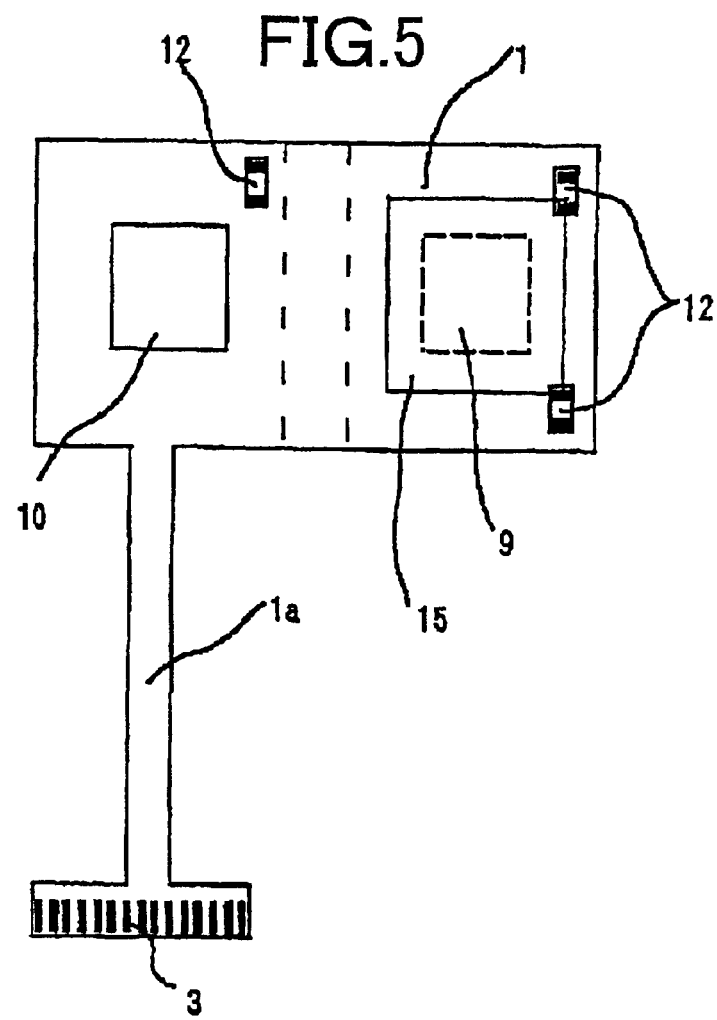
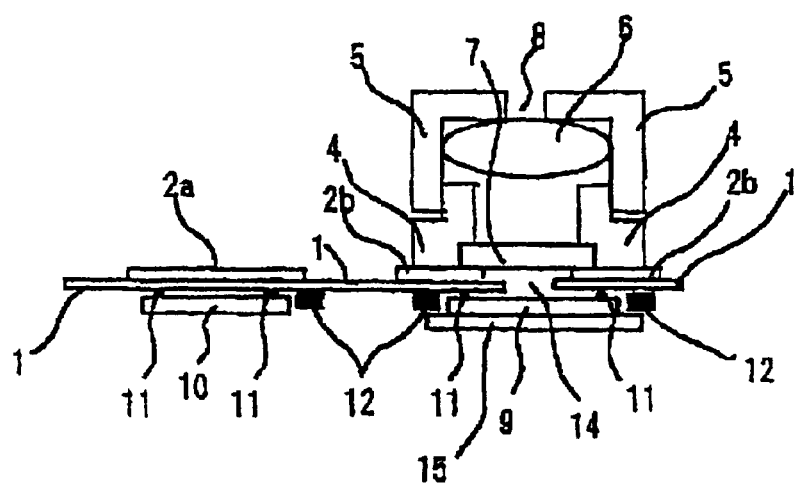

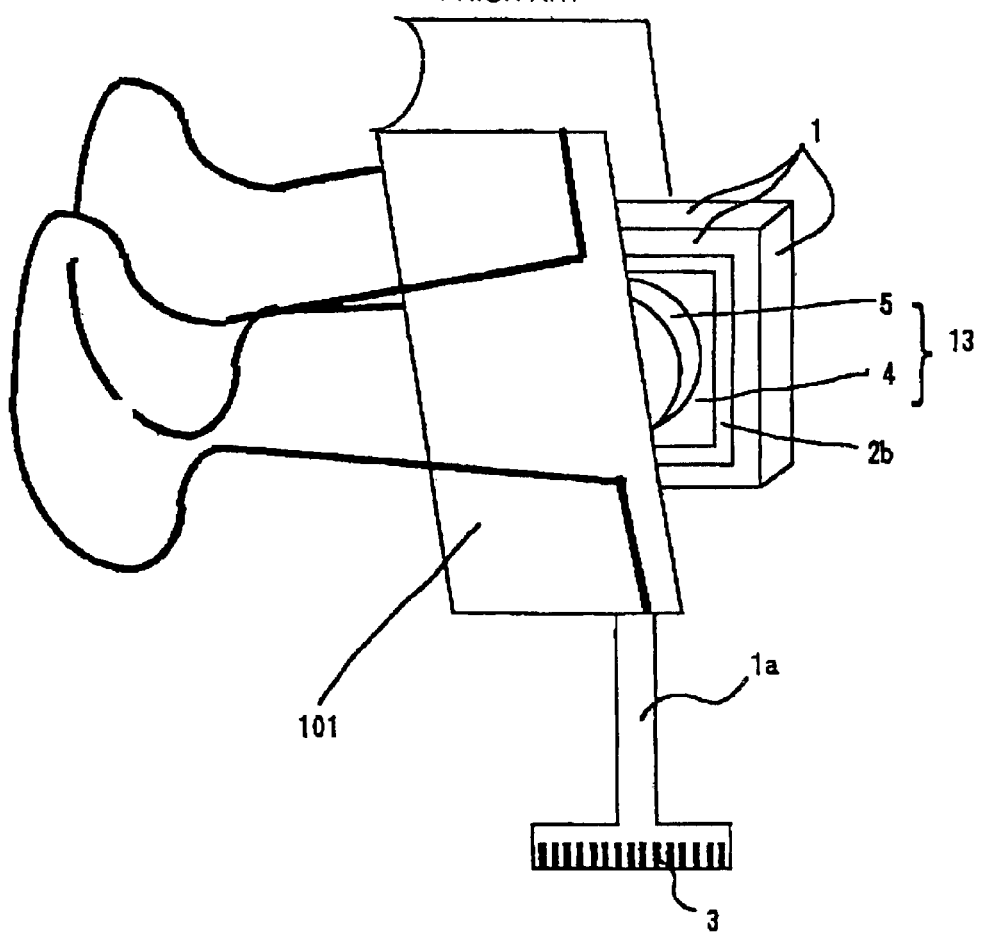

METHOD FOR PRODUCING SOLID-STATE IMAGE PICKUP DEVICE

FIELD OF THE INVENTION

The present invention relates to a production method for a solid-state image pickup (sometimes herein referred to as a solid image pickup device) device comprising a solid-state image pickup element (sometimes herein referred to as a solid image pickup element) and an optical lens. More specifically, this invention relates to a production method for a solid-state image pickup device suitable for miniaturization, having a small volume and high external shape and size accuracy.

BACKGROUND OF THE INVENTION

FIG. 13 shows an example of a conventional production method for a solid-state image pickup device. The solid-state image pickup device comprises a solid-state image pickup element and an optical lens, with a flexible wiring board folded and fixed. In FIG. 13, the numeral 1 denotes a flexible wiring board (hereinafter referred to as an FPC), 1a denotes an FPC lead section, 2b denotes a reinforcing plate, 3 denotes an external connection element, 4 denotes a fixed base, 5 denotes a fixed cap, 13 denotes a housing, and 101 denotes a pressing clip.

The conventional production method will be explained while referring to FIG. 13. First, the FPC 1 is folded for the miniaturization of device. An adhesive is supplied to the inner part of the folded FPC 1 generated at the time. Then, the pressing clip 101 is applied such that the fixed cap 5 and the FPC 1 are forced lightly by the spring force of the pressing clip 101. Next, by hardening the adhesive in this state, a miniaturized solid image pickup device can be obtained.

Since the conventional solid image pickup device has the above-mentioned configuration, it is difficult to stabilize the spring force of the pressing clip 101 at the time of folding the FPC 1 and fixing the same with the adhesive so there is a large external size irregularity.

Moreover, since irregularity is generated in terms of the spring force of the pressing clip 101 and the position of the load applied on the contacting part at the time of clipping, a problem of difficulty in constantly providing the solid image pickup device shape, is involved.

The shape instability and the external size irregularity require an excessive size tolerance in a storage space in storing the solid image pickup device in a case or the like, so there is a serious problem in designing when, in particular, mounting the pickup device in a small appliance such as a portable phone. Furthermore, the part of the fixed cap 5 to be contacted with the pressing clip 101 can easily be flawed, and thus a problem is also involved in terms of the external appearance.

SUMMARY OF THE INVENTION

It is an object of this invention to provide a solid image pickup device with a miniaturized shape and size, and a reduced size error while maintaining the image pickup performance and the shape performance of the solid image pickup device so as to enable easily assembly in a small appliance, such as a portable phone.

The production method according to one aspect of this invention provides a method of producing a solid image pickup device comprising a solid image pickup element, and an optical lens held in a housing provided in a flexible wiring board. This method comprises, using a fixing device, bonding and fixing the flexible wiring board in a folded state corresponding to an external shape of the solid image pickup device. According to this method, the part in contact with the fixed cap and the part in contact with the flexible wiring board (or the reinforcing plate) can always be pressured at the same position.

The production method according to another aspect of this invention provides a method of producing a solid image pickup device comprising a solid image pickup element, an optical lens held in a housing, and an IC part provided in a flexible wiring board. This method comprises, using a fixing device, bonding and fixing the flexible wiring board in a folded state corresponding to an external shape of the solid image pickup device.

Other objects and features of this invention will become apparent from the following description with reference to the accompanying drawings.

BRIEF DESCRIPTION OF THE DRAWINGS

FIG. 5 is a developed view of the FPC according to the first embodiment of the present invention, FIG. 6 is a cross-sectional view of the solid image pickup device according to the first embodiment of the present invention, FIG. 13 is a diagram showing a conventional production method for a solid image pickup device.

DETAILED DESCRIPTIONS

Embodiments of the present invention will be explained below while referring to the accompanying drawings.

FIGS. 1 to 6 are show the structure and the production procedure of a solid image pickup device according to first embodiment of the present invention.

Figure 1:
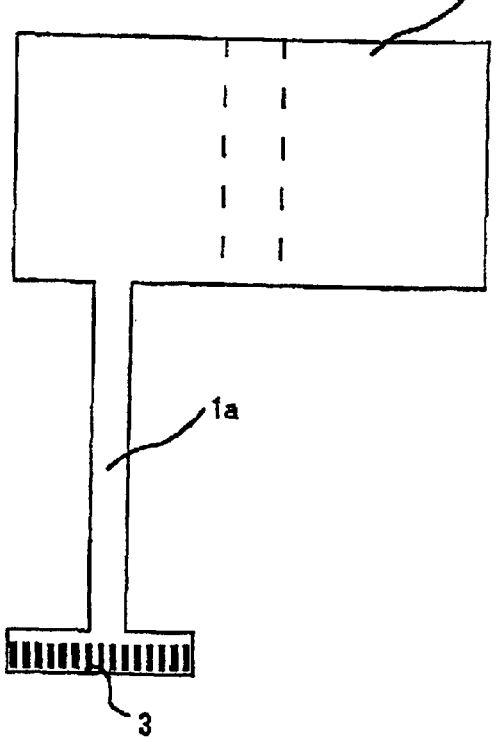
FIG. 1 is a developed view of an FPC according to a first embodiment of the present invention.

FIG. 1 shows the shape of the FPC 1 comprising a film material made of a polyimide, or the like. The broken line parts show the positions to be folded. Moreover, the numeral 1a denotes an FPC lead line section, and the numeral 3 an external connection terminal, which represent a part of the FPC 1.

Figure 2:
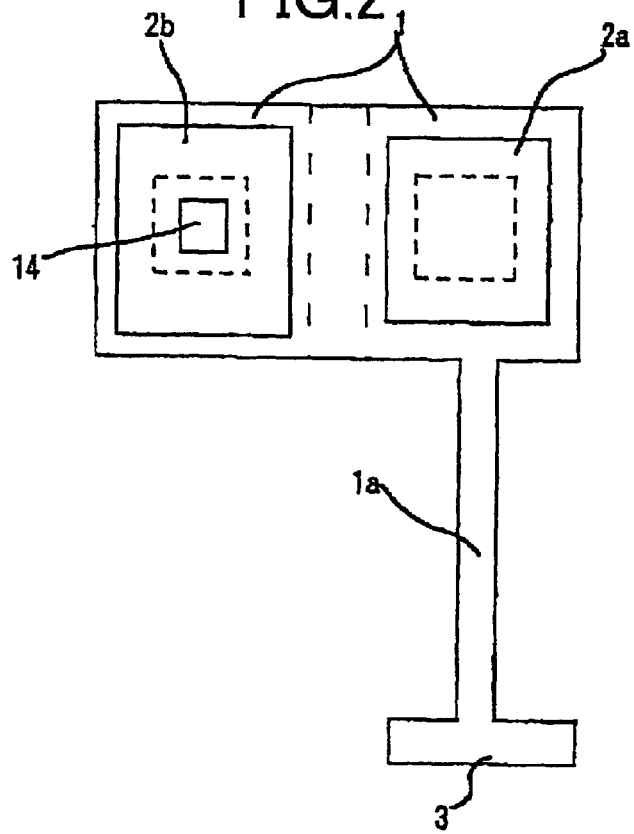
FIG. 2 is a developed view of the FPC according to the first embodiment of the present invention.

FIG. 2 shows the state with a reinforcing plate 2a and a reinforcing plate 2b attached on the FPC 1. The reinforcing plate 2b is provided with an opening section 14 for focusing an image by directing a light beam to an image pickup area of a solid image pickup element 9. Moreover, the frame of the broken line under the reinforcing plate 2a denotes the mounting position for an IC part 10, and the frame of the broken line under the reinforcing plate 2b denotes the mounting position for the solid image pickup element 9, respectively.

Figure 3:
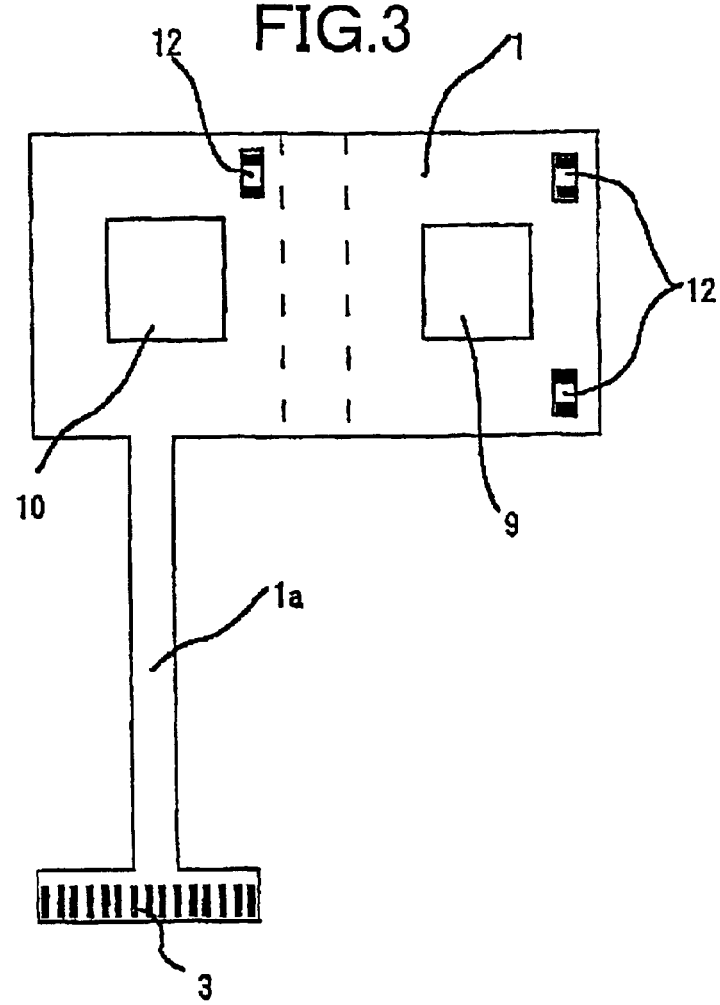
FIG. 3 is a developed view of the FPC according to the first embodiment of the present invention.

FIG. 3 shows the state with a chip part 12 mounted on the FPC 1 by soldering, and the solid image pickup device 9 and the IC part 10 mounted by the flip chip bonding.

Figure 4:
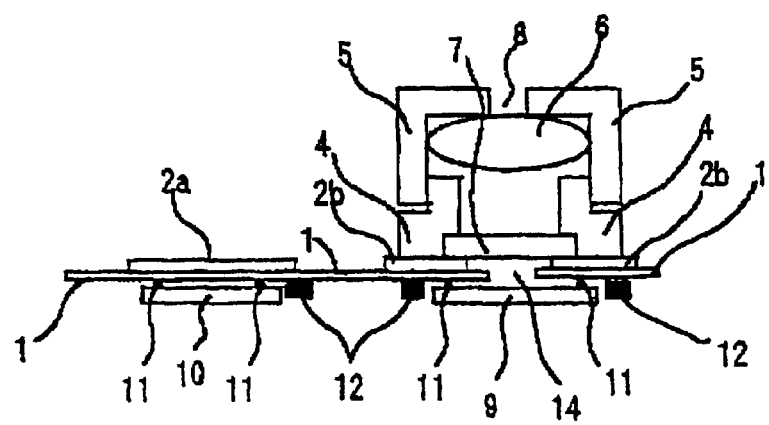
FIG. 4 is across-sectional view of a solid image pickup device according to the first embodiment of the present invention.

FIG. 4 is a cross-sectional view in the state with the optical parts mounted. The numeral 4 denotes a fixed base, 5 a fixed cap, 6 an optical lens, 7 an optical filter, and 8 a diaphragm section, respectively. The numeral 11 denotes a flip chip connection section.

FIG. 5 shows the state with an adhesive 15 provided on the FPC 1. Here, the adhesive 15 may be a liquid adhesive coated and dried, or a sheet-like adhesive attached. FIG. 5 shows the state with a sheet-like adhesive film attached on the solid image pickup element 9 and the chip part 12. Moreover, FIG. 6 is a cross-sectional view of FIG. 5.

Figure 7:
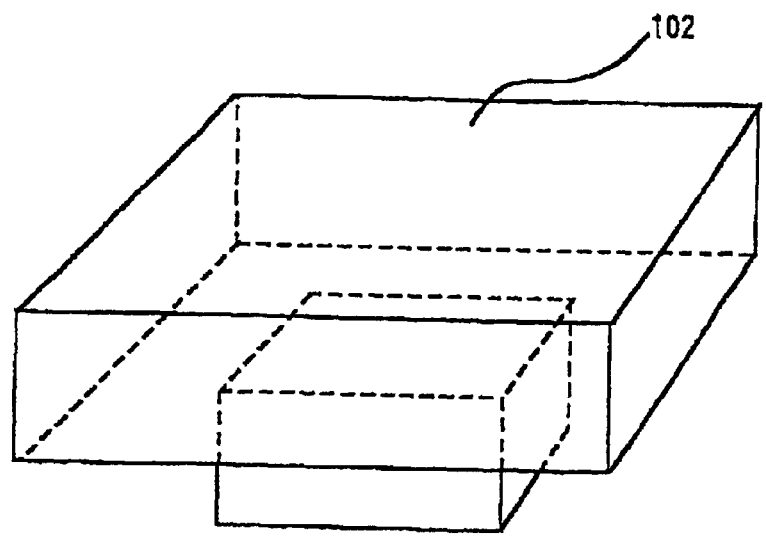
FIG. 7 is a diagram showing the external appearance of a pressing section of a fixing device according to the first embodiment of the present invention.
Figure 8:
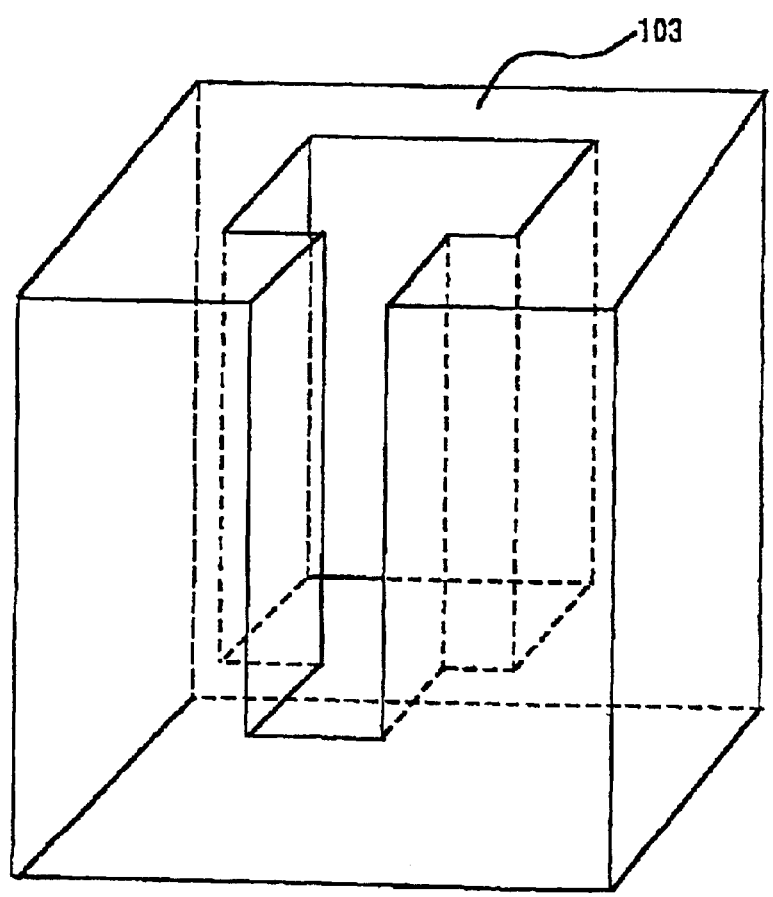
FIG. 8 is a diagram showing the external appearance of a holding section of the fixing device according to the first embodiment of the present invention.

FIGS. 7 and 8 show a fixing device used in the production method according to the present invention. FIG. 7 shows a pressing section 102, and FIG. 8 shows a holding section 103. Moreover, a projecting part of the pressing section 102 fits into a corresponding recess of the holding section 103. The solid-state image pickup device is folded at the broken line part of the FPC 1 and placed in the recess in the holding section 103 in the folded-state. The recess shape matches the outer shape of the folded solid image pickup device. Then, the pressing section 102 is fitted into the holding section 103 with a certain pressure and fixed in place. After hardening the adhesive 15, a miniaturized solid-state image pickup device 201 can be taken out of the fixing device.

Figure 9:
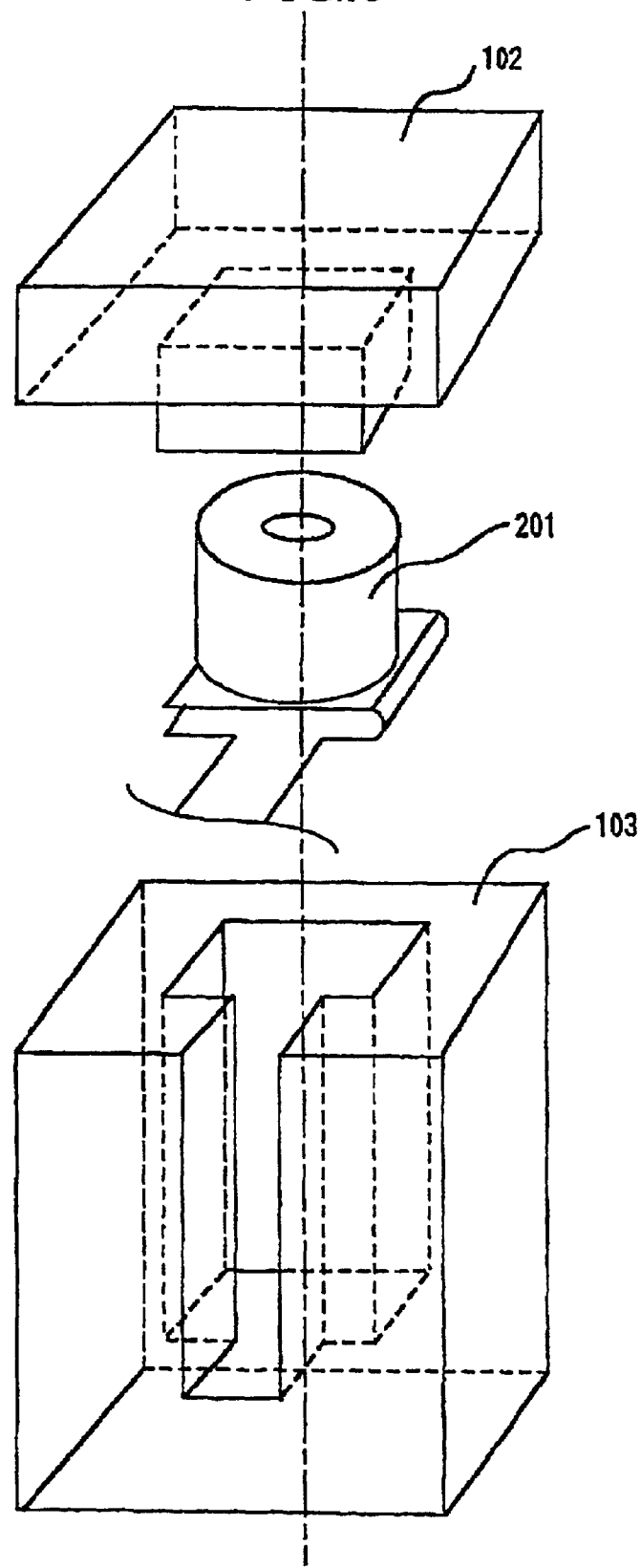
FIG. 9 is a diagram showing the external appearance of the positional relationship between the fixing device and the solid image pickup device according to the first embodiment of the present invention.

The positional relationship of the above-mentioned fixing device and the solid image pickup device 201 is shown further in FIG. 9.

Here, the adhesive 15 may be hardened in an ordinary temperature, or hardened by heating in a heating furnace together with the fixing device.

Moreover, the certain pressure applied on the pressing section 102 may be provided by placing a weight of a certain load on the pressing section 102, or by providing a screw hole in the holding section 103 and fastening the pressing section 102 with a bolt, or the like.

Figure 10:
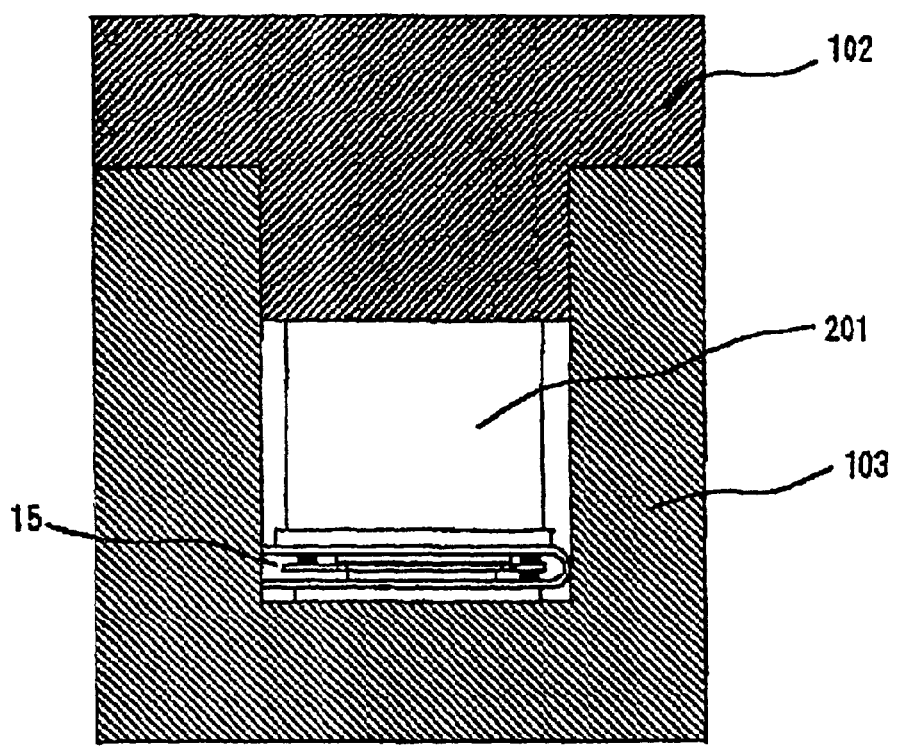
FIG. 10 is a cross-sectional view of the configuration at the time of bonding according to the first embodiment of the present invention.

FIG. 10 is a cross-sectional view showing the state with the solid image pickup device 201 fitted in the pressing section 102 and the holding section 103.

Figure 11:
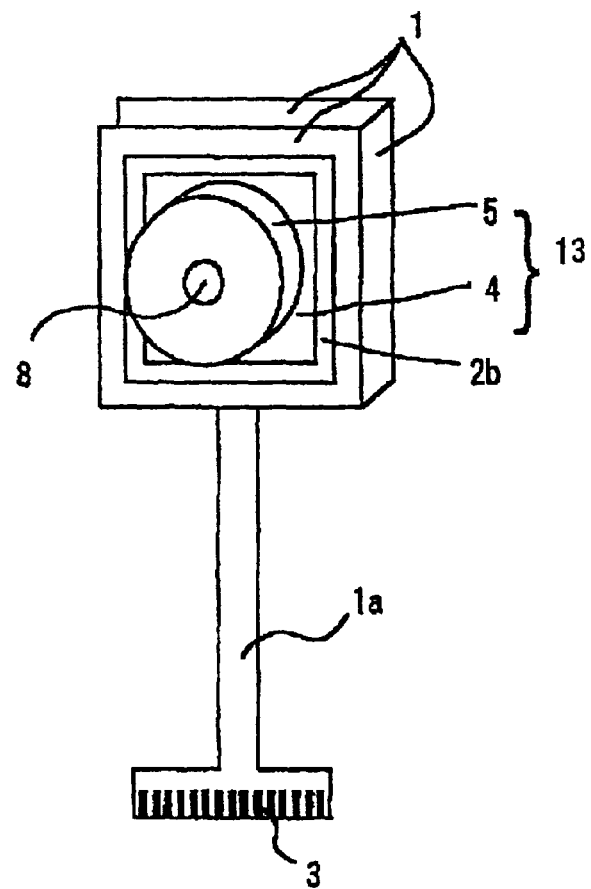
FIG. 11 is a diagram showing the external appearance of the solid image pickup device according to the first embodiment of the present invention.

Moreover, FIG. 11 shows the external appearance of the solid image pickup device 201 according to a production method of the present invention, completed by taking out from the fixing device, and evening the external shape.

Figure 12:
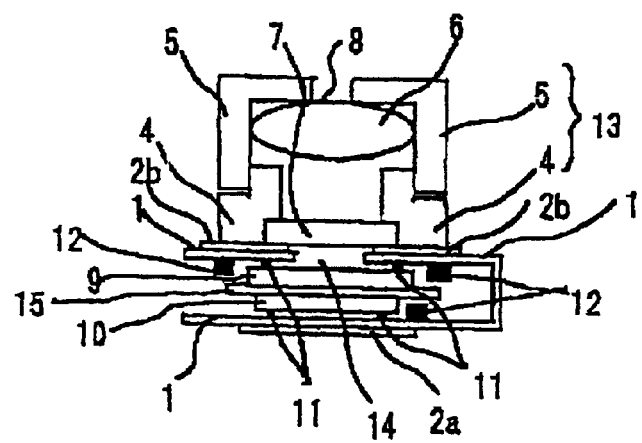
FIG. 12 is a cross-sectional view of the solid image pickup device according to the first embodiment of the present invention.

Furthermore, FIG. 12 is a cross-sectional view of the principal part of the solid image pickup device 201 shown in FIG. 11.

Since the solid image pickup device according to the first embodiment of the present invention is produced in the above-mentioned configuration, the part of the pressing section 102 in contact with the fixed cap 5 and the part of the holding section 103 in contact with the FPC 1 (or the reinforcing plate 2a) can be pressured always at the same position as well as the contacted part of the side surface part of the solid image pickup device can further be at the same position, the pressing force can be stabilized on the entire surface of the solid image pickup device so that the shape of the produced solid image pickup device can be constant and even and irregularity of the external size value can be reduced at a low level.

As a second embodiment of this invention, a degassing hole may be provided in the pressing section 102 and the holding section 103 with the other configuration being the same as the fixing device explained in the first embodiment. This will facilitate the discharge of the gas generated from the adhesive 15 to the outside at the time of bonding and fixing. If the adhesive 15 is such that it does not generate a gas, then the degassing hole need not be provided.

As heretofore explained, the production method for a solid image pickup device according to the present invention comprises bonding and fixing a folded flexible wiring board with an adhesive after being fitted in a mold corresponding to the external shape of the solid image pickup device, and taking out from the mold after completing the bonding and fixation by hardening the adhesive. Therefore, the part in contact with the fixed cap and the part in contact with the flexible wiring board (or the reinforcing plate) can always be pressured at the same position, and thus the shape of the produced solid image pickup device can be constant and even and irregularity of the external size value can be reduced at a low level.

Moreover, the contacted part are always pressed at the same position also as to the side surface part of the solid image pickup device so that the pressing force can be stabilized on the entire surface of the solid image pickup device. Therefore, the shape of the produced solid image pickup device can be stable and even and irregularity of the external size value can be reduced at a low level.

Furthermore, the solid image pickup element is provided on one surface and the optical lens on the other surface of the flexible wiring board. Therefore, a miniaturized solid image pickup device can be obtained.

Moreover, the flexible wiring board and the solid image pickup element are bonded, and further the flexible wiring board and an IC part by the flip chip connection. Therefore, a miniaturized solid image pickup device can be obtained.

Furthermore, a hole for ventilation is provided in a pressing section and a holding section for discharging the gas generated at the time of hardening an adhesive. Therefore, a bonding operation can be facilitated.

Moreover, the pressing section evenly pressures at the time of bonding. Therefore, a solid image pickup device with the excellent size accuracy can be obtained.

Furthermore, since the pressing section evenly pressures at the time of bonding, flaw, or the like can hardly be generated, and thus a solid image pickup device with a good external appearance can be obtained.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of producing a solid image pickup device having a solid-state image pickup element, an optical lens, a housing containing the optical lens, and a flexible wiring board on which the housing is mounted, the method comprising folding the flexible wiring board;

inserting the flexible wiring board, after folding, into a recess within a fixing device, surrounding and holding the flexible wiring board in a shape corresponding to an external shape of said solid-state image pickup device; and bonding the flexible wiring board in the shape corresponding to the external shape of said solid-state image pickup device.

2. The method according to claim 1, comprising mounting the solid-state image pickup element on a first surface of the flexible wiring board and mounting the housing containing the optical lens on a second surface of the flexible wiring board.

3. The method according to claim 1, wherein the flexible wiring board includes an integral lead line with an electrode for external connection of the lead line.

4. The method according to claim 1, comprising flip chip bonding the solid-state image pickup element to the flexible wiring board.

5. The method according to claim 1, including mounting an optical filter in the housing.

6. The method according to claim 1, wherein said fixing device comprises at least a holding section including the recess and receiving said solid-state image pickup device, and including inserting a pressing section into the recess of said holding section to press the housing and flexible wiring board during bonding of the flexible wiring board.

7. The method according to claim 6, wherein said pressing section of said fixing device includes a degassing hole.

8. The method according to claim 6, wherein said holding section of said fixing device includes a degassing hole.

9. A method of producing a solid-state image pickup device having a solid-state image pickup element, a housing, an optical lens held in the housing, a flexible wiring board, and an IC (integrated circuit) mounted on the flexible wiring board, the method comprising folding the flexible wiring board;

inserting the flexible wiring board, after folding, into a recess within a fixing device, surrounding and holding the flexible wiring board in a shape corresponding to an external shape of said solid-state image pickup device; and bonding the flexible wiring board in the shape corresponding to the external shape of said solid-state image pickup device.

10. The method according to claim 9, comprising flip chip bonding the solid image pickup element to the flexible wiring board.

11. The method according to claim 9, comprising bonding and fixing the solid-state image pickup element and the IC.

12. The method according to claim 9, wherein said fixing device comprises at least a holding section including the recess and receiving said solid-state image pickup device, and including inserting a pressing section into the recess of said holding section to press the housing and flexible wiring board during bonding of the flexible wiring board.

13. The method according to claim 12, wherein said pressing section of said fixing device includes a degassing hole.

14. The method according to claim 12, wherein said holding section of said fixing device includes a degassing hole.

* * * * *